(12) United States Patent
Li et al.

(10) Patent No.: US 8,446,720 B2
(45) Date of Patent: May 21, 2013

(54) MOUNTING APPARATUS FOR EXPANSION CARD

(75) Inventors: Zhi-Xin Li, Shenzhen (CN); Jun-Xiong Zhang, Shenzhen (CN); Bang-Wei Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 356 days.

(21) Appl. No.: 13/012,952

(22) Filed: Jan. 25, 2011

(65) Prior Publication Data

US 2012/0134088 A1 May 31, 2012

(30) Foreign Application Priority Data

Nov. 29, 2010 (CN) .......................... 2010 1 0564576

(51) Int. Cl.
*H05K 7/14* (2006.01)
(52) U.S. Cl.
USPC .................. 361/679.4; 361/679.01; 312/223.1
(58) Field of Classification Search
USPC ............. 361/679, 57, 58, 724–729, 720, 721, 361/679.01–679.61, 732, 735–737, 740, 361/741, 747, 748, 754–756, 759, 800–807, 361/810, 752, 753, 816, 818, 679.4, 361/679.31–679.39; 312/223.1–223.2; 211/41.17; 439/327, 328, 372, 377
See application file for complete search history.

(56) References Cited

U.S. PATENT DOCUMENTS

2008/0000850 A1* 1/2008 Peng et al. ................. 211/41.17

* cited by examiner

*Primary Examiner* — Jinhee Lee
*Assistant Examiner* — Ingrid Wright
(74) *Attorney, Agent, or Firm* — Altis Law Group, Inc.

(57) ABSTRACT

A mounting apparatus for mounting an expansion card to a rear panel of an electronic device includes a latching member, an operation member, and two connection members. The latching member includes four drive plates, a connection plate, and four latching portions. Each of the drive plates defines a rail therein. The operation member includes four pins, a handle, and a resilient portion. The resilient portion includes a latch block. The two connection members pass through the latching member and the rear panel. Each of the four pins is slidably received in the rail to rotate the latching member, each of the four latching portions is received in a first block plate of the expansion card, the latch block of the operation member is received in a latch of the rear panel, thereby mounting the expansion card to the rear panel.

18 Claims, 7 Drawing Sheets

MOUNTING APPARATUS FOR EXPANSION CARD

BACKGROUND

1. Technical Field

The present disclosure relates to device mounting, and particularly, to an expansion card mounting apparatus for an electronic device.

2. Description of Related Art

Computer systems typically require or include expansion cards providing additional or extended functionality. A frequently used expansion card includes a main body electrically connectable with a motherboard in a computer system, and a generally L-shaped block plate installable on a rear plate of the computer system. The block plate is typically installed on the rear plate by a screw. However, if the screw is not properly fastened, the expansion card easy dislodges or misaligns in the case such that a distal end of the expansion card may experience damaging impact.

Therefore, a mounting apparatus is desired to overcome the limitations described.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
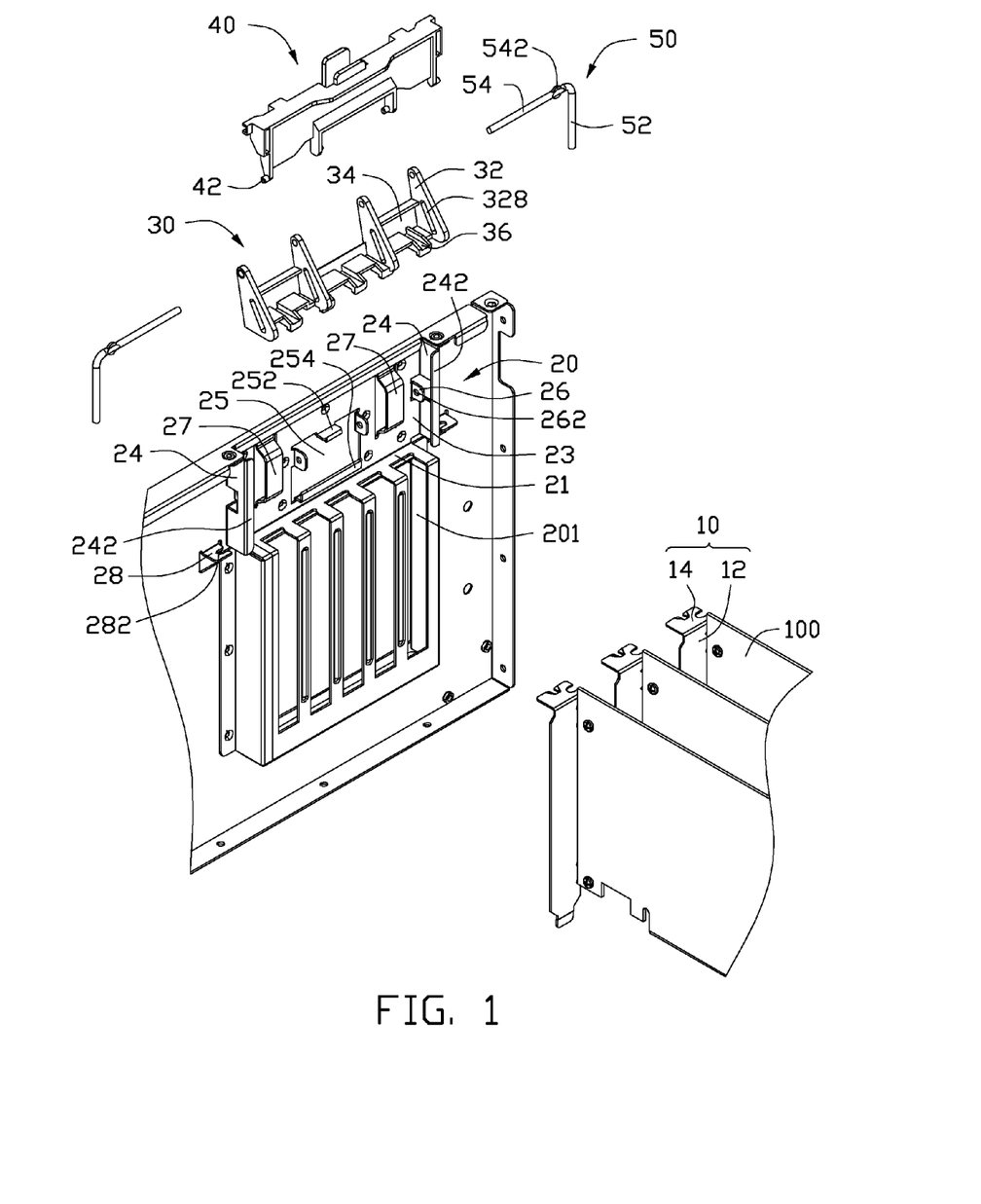
FIG. 1 is an exploded, isometric view of a mounting apparatus according to an exemplary embodiment applied with an expansion card and a rear panel.

Referring to FIG. 1, an exemplary embodiment of a mounting apparatus is provided for mounting an expansion card 100 to a rear panel 20 of an electronic device (not shown). The mounting apparatus includes a latching member 30, an operation member 40, and two connection members 50. In the illustrated embodiment, the electronic device is a computer.

The expansion card 100 includes a first block plate 10. The first block plate 10 is L-shaped and includes a connection portion 12 fixed to an end of the expansion card 100, and an angled portion 14 is angled from a top end of the connection portion 12.

The rear panel 20 includes a plurality of elongated card slots 201 defined therein, a support plate 21 extending inward from the rear panel 20 adjacent to the card slots 201, a main plate 23 positioned above the support plate 21, a pair of second block plates 24 extending from the main plate 23, an opening 25 defined in the rear panel 20, four pivot plates 26 fixed to the main plate 23, two bridge clips 27 formed on the main plate 23, and two tabs 28 fixed to the rear panel 20, adjacent to an outer side of the pair of second block plates 24 respectively. The card slots 201 are parallel to each other. Each of the second block plates 24 includes a restrictor plate 242 extending inward from a front end thereof, and a through hole (not shown) defined therein. The opening 25 is positioned between the pair of second block plates 24. A latch 252 extends from the main plate 23 and is positioned above the opening 25. An L-shaped first stop portion 254 extends from the main plate 23 and is positioned below the opening 25. The four pivot plates 26 are separated by a distance and positioned between the pair of second block plates 24, corresponding to the opening 25. Each of the four pivot plates 26 includes a first pivot hole 262 defined therein. The two bridge clips 27 are positioned between the pair of second block plates 24. One of the bridge clips 27 is positioned on a right side of the opening 25, between two pivot plates 26. The other of the bridge clips 27 is positioned on a left side of the opening 25, between the other two pivot plates 26. Each of the tabs 28 includes a notch 282 defined therein.

Figure 2:
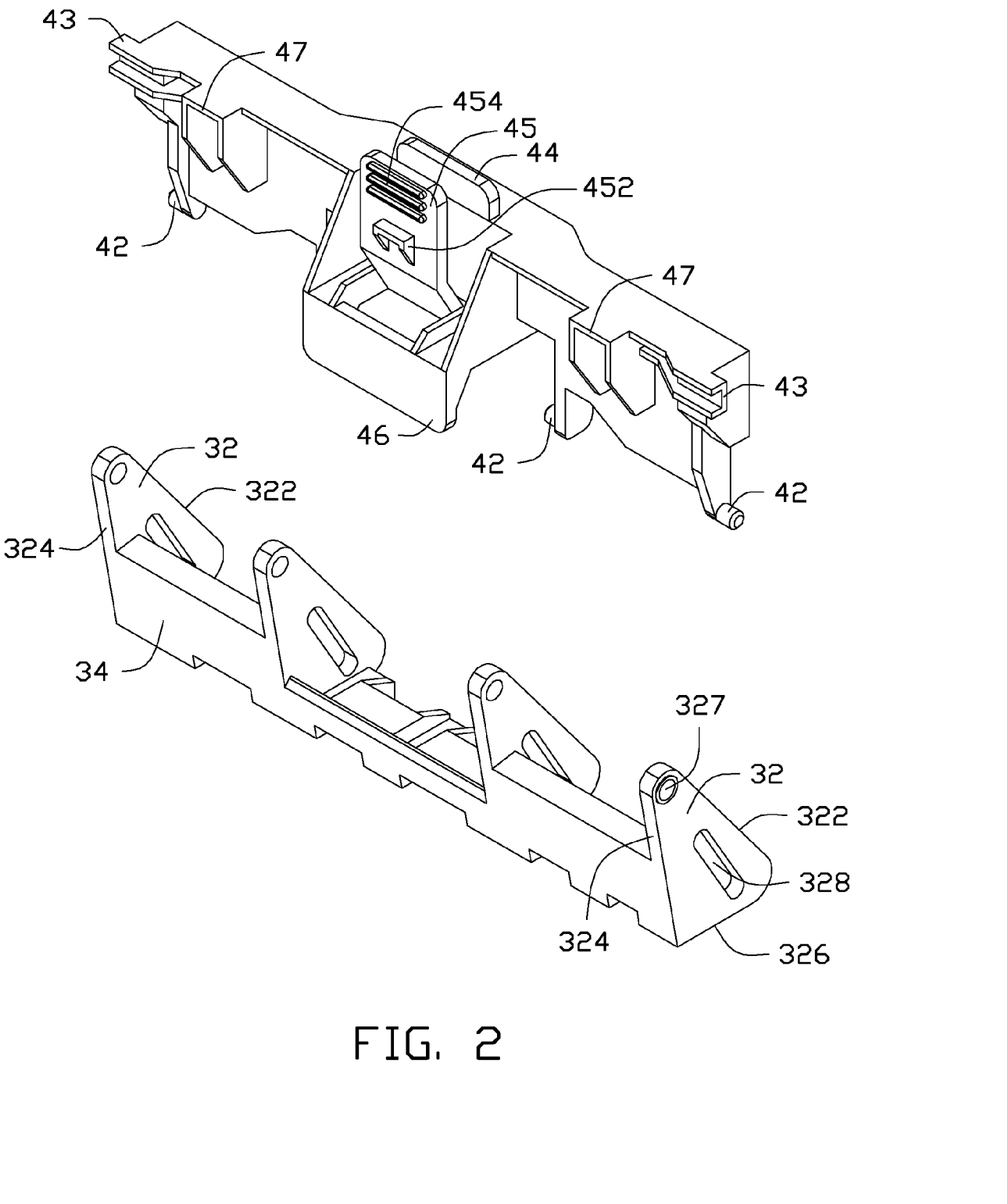
FIG. 2 is an enlarged view of a latching member and an operation member of FIG. 1, but viewed from another aspect.

Referring to FIG. 2, the latching member 30 includes a plurality of parallel drive plates 32, a connection plate 34 fixed to the drive plates 32, and a plurality of latching portions 36 fixed to a bottom of the latching member 30. In the illustrated embodiment, the plurality of parallel drive plates 32 is shown as four parallel triangular drive plates, and the plurality of latching portions 36 is shown as four latching portions. The drive plates 32 are separated from each other by a distance. Each of the drive plates 32 includes a bevel edge 322, a first straight edge 324, and a second straight edge 326. An included angle between the bevel edge 322 and the first straight edge 324 defines a second pivot hole 327 therein. Each of the drive plates 32 includes a rail 328 defined therein. The rail 328 is positioned close to the bevel edge 322, and substantially parallel to the bevel edge 322. The connection plate 34 connects with the first straight edge 324 of each of the drive plates 32. The latching portions 36 are parallel to the second straight edge 326. A front end of each of the latching portions 36 is L-shaped.

The operation member 40 includes a plurality of pins 42 each fixed to a bottom of the operation member 40 corresponding to the rail 328 of each of the drive plates 32, two block portions 43 extending from two opposite sides of the operation member 40 respectively, a handle 44 extending from a top end of the operation member 40, a resilient portion 45 parallel to the handle 44, a second stop portion 46 extending at an angle from a bottom end of the operation member 40, and two clip blocks 47 respectively positioned close to the two block portions 43 corresponding to the two bridge clips 27. In the illustrated embodiment, the plurality of pins 42 is shown as four pins. The resilient portion 45 includes a latch block 452 fixed on a side thereof away from the handle 44, and an anti-skid bumper 454 fixed thereon and positioned above the latch block 452.

Each of the two connection members 50 is L-shaped and includes a first post 52, and a second post 54. The second post 54 includes a raised block 542 fixed on an outer side thereof and positioned close to a curved portion of each of the two connection members 50.

Figure 3:
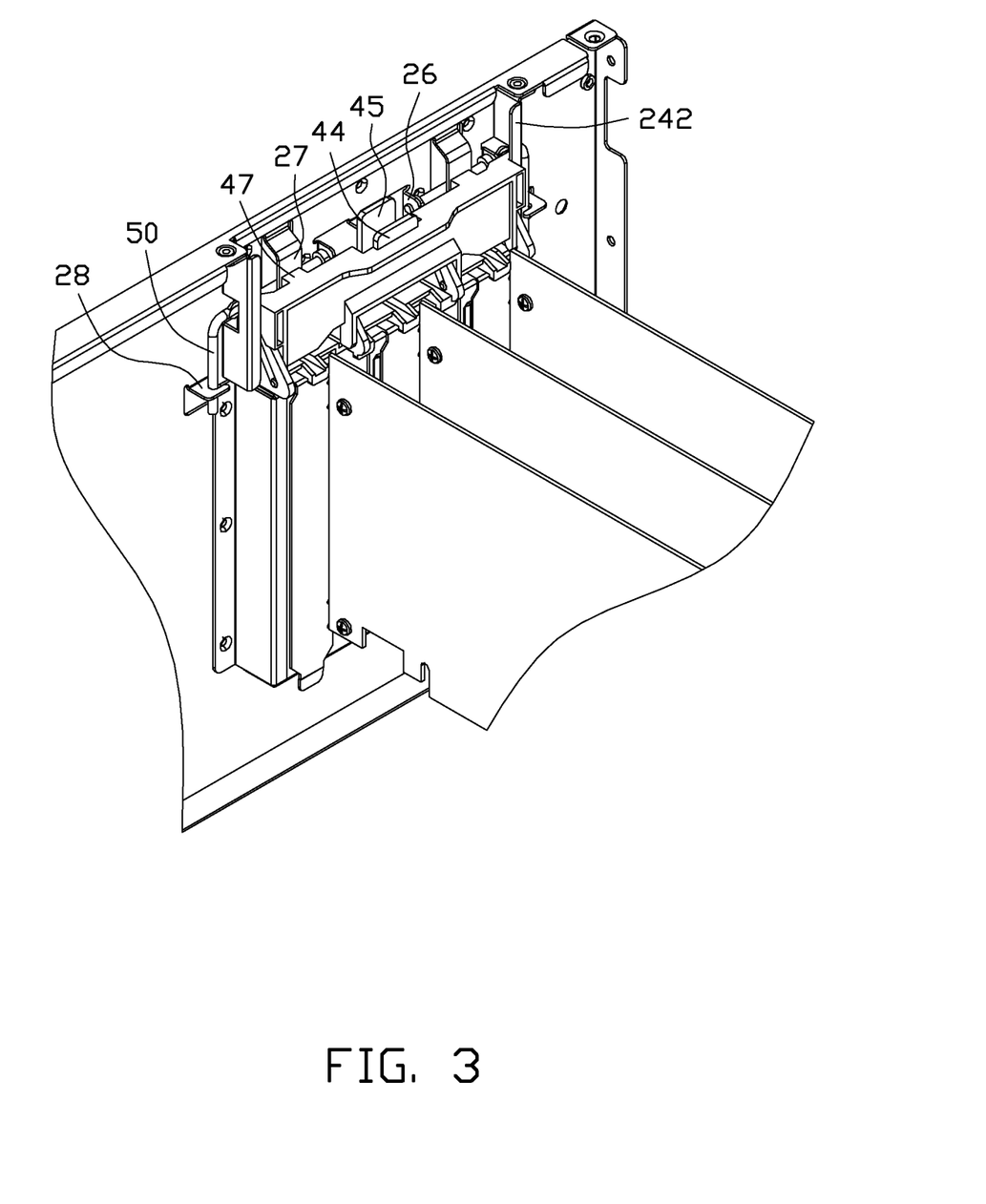
FIG. 3 is an assembled, isometric view of FIG. 1.
Figure 4:
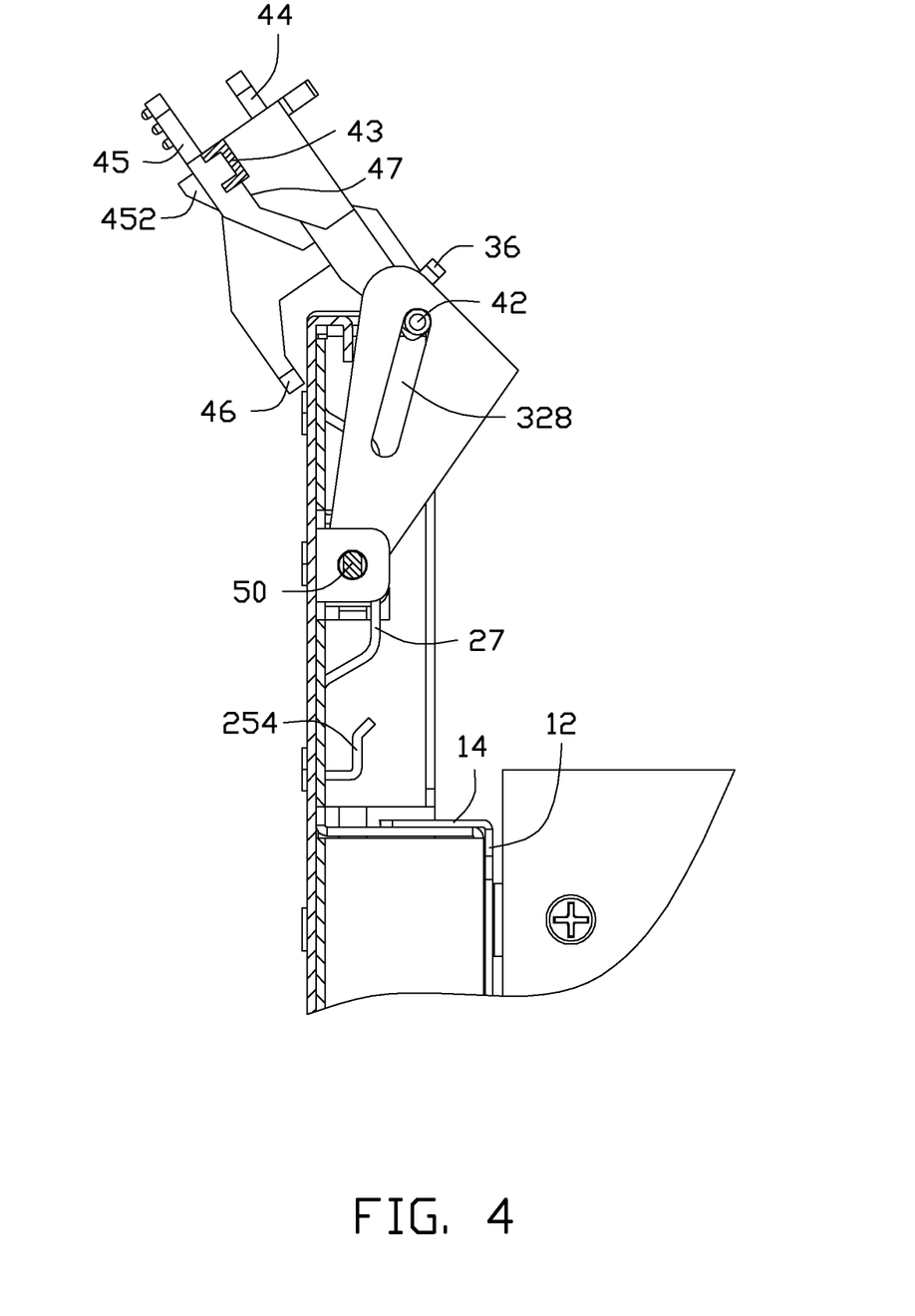
FIGS. 4-6 are cutaway views of FIG. 3, respectively showing an unlocked state, a lock preparation state, and a locked state, of the mounting apparatus.
Figure 5:
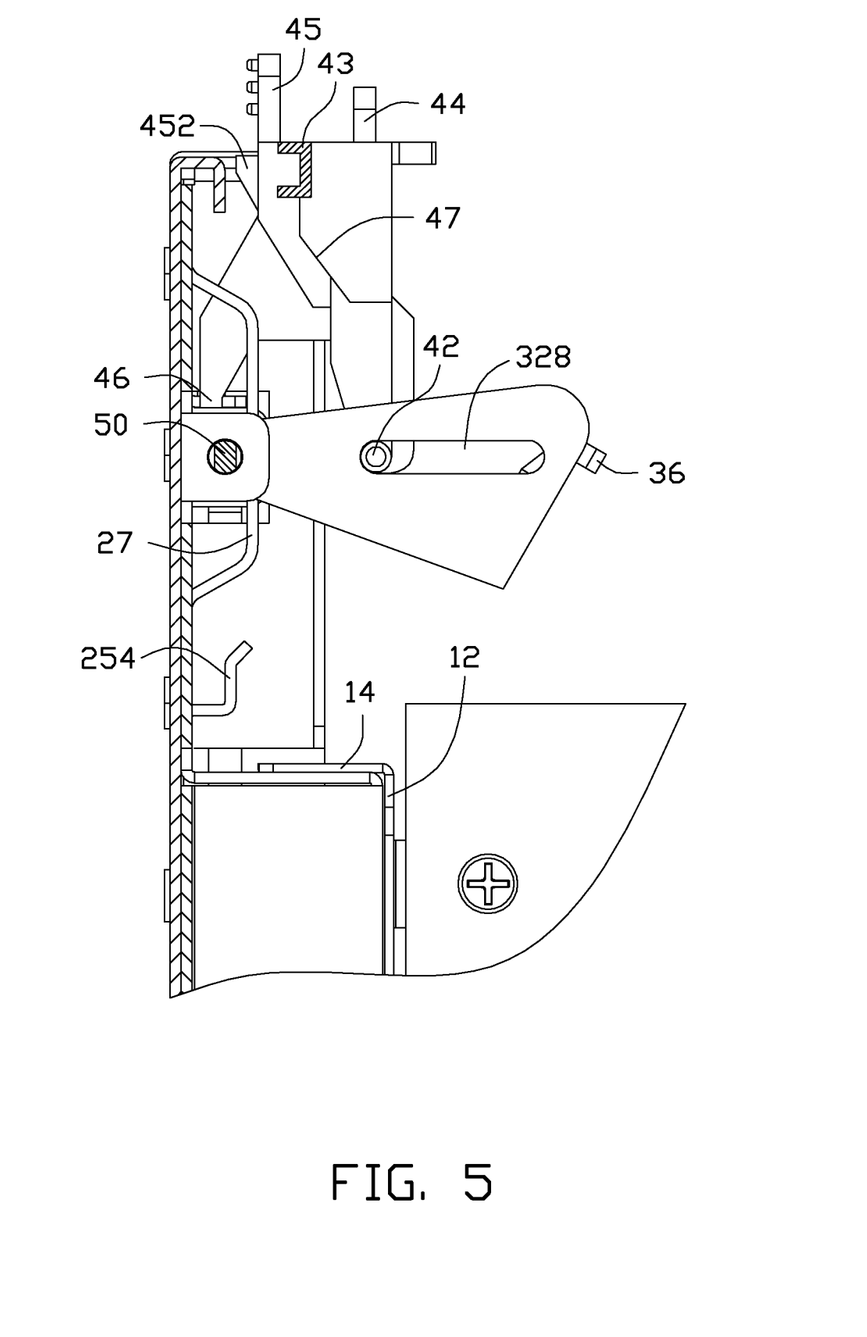
Figure 6:
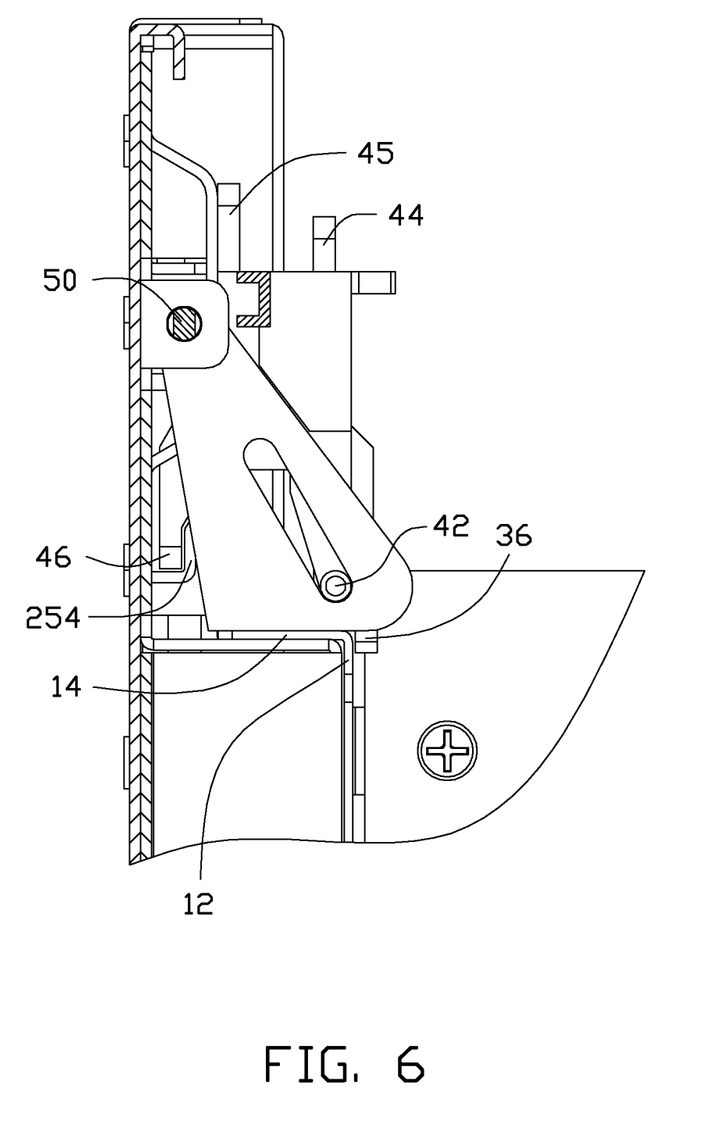
Figure 7:
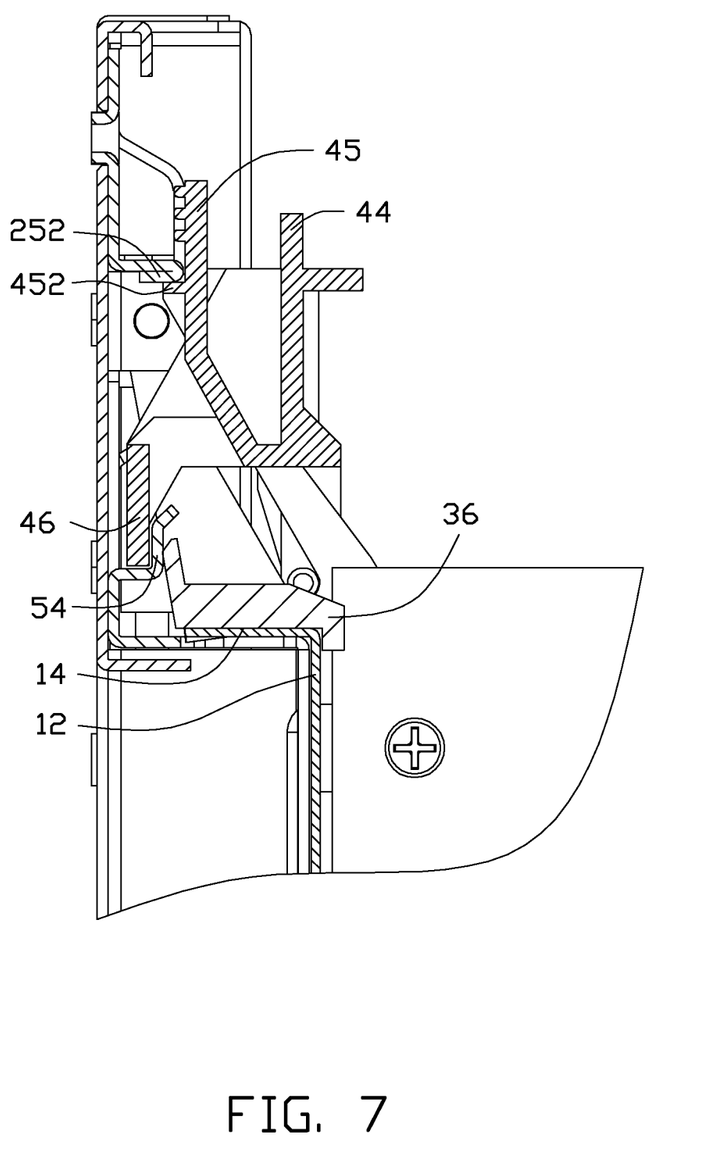
FIG. 7 is a cutaway view of FIG. 6, but viewed from another aspect.

Referring to FIG. 3, in assembly of the latching member 30 to the rear panel 20, the latching member 30 is received between the pair of second block plates 24, the second pivot hole 327 of each of the drive plates 32 is aligned with the first pivot hole 262 of each of the pivot plates 26. The latching member 30 and the rear panel 20 can be secured to each other by the second post 54 of each of the two connection members 50 passing through the through hole of each of the pair of second block plates 24, the second pivot hole 327, and the first pivot hole 262. The first post 52 of each of the two connection members 50 is received in the notch 282 of each of the tabs 28 to retain the two connection members 50 in the rear panel 20. The raised block 542 of the second post 54 abuts each of the pair of second block plates 24 to limit passage of the second post 54 through the through hole of each of the pair of second block plates 24.

In assembly of the operation member 40 to the latching member 30, each of the pins 42 of the operation member 40 is received in the rail 328 of each of the drive plates 32.

Referring to FIGS. 4-7, in mounting the expansion card 100 to the rear panel 20, the operation member 40 is withdrawn from the rear panel 20. Each of the pins 42 of the operation member 40 is slidably received in the rail 328 to rotate the latching member 30 outward until sufficient space is provided for the expansion card 100 and a circuit board (not shown) of an electronic device to be secured to each other. The first block plate 10 of the expansion card 100 abuts one of the card slots 201, and the angled portion 14 of the first block plate 10 abuts the support plate 21.

The operation member 40 is then pushed toward the rear panel 20. Each of the pins 42 of the operation member 40 is slidably received in the rail 328 to rotate the latching member 30 inward until each of the latching portions 36 is received in a gap of the angled portion 14 of the first block plate 10. Accordingly, the latch block 452 of the operation member 40 is received in a lower side of the latch 252 of the rear panel 20, each of the two block portions 43 of the operation member 40 is received in an inner side of the restrictor plate 242 of the rear panel 20, the second stop portion 46 is received in an inner side of the first stop portion 254, and the two clip blocks 47 snugly abut the two bridge clips 27 respectively.

During removal of the expansion card 100, the resilient portion 45 is operated to deform the operation member 40 to disengage the latch block 452 from the latch 252 of the rear panel 20. Then the operation member 40 is withdrawn from the rear panel 20. Thus the expansion card 100 can be removed from the circuit board.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mounting apparatus for mounting an expansion card to a rear panel of an electronic device, the mounting apparatus comprising:
   a latching member comprising four drive plates, a connection plate fixed to the drive plates, and four latching portions fixed to a bottom of the latching member, wherein each of the drive plates defines a rail therein;
   an operation member comprising four pins each fixed to a bottom of the operation member corresponding to the rail of each of the drive plates, a handle extending from a top end of the operation member, and a resilient portion parallel to the handle, wherein the resilient portion comprises a latch block fixed on a side thereof away from the handle; and
   two connection members passed through the latching member and the rear panel for securing the latching member to the rear panel;
   wherein each of the four pins of the operation member is slidably received in the rail to rotate the latching member, each of the four latching portions is received in a first block plate of the expansion card, the latch block of the operation member is received in a latch of the rear panel, thereby mounting the expansion card to the rear panel.

2. The mounting apparatus of claim 1, wherein the rear panel comprises a plurality of elongated card slots defined therein, a support plate extending inward from the rear panel adjacent to the card slots, a main plate positioned above the support plate, a pair of second block plates extending from the main plate, an opening defined in the rear panel, four pivot plates fixed to the main plate, two bridge clips formed on the main plate, and two tabs fixed to the rear panel, adjacent to an outer side of the pair of second block plates respectively; wherein each of the four pivot plates comprises a first pivot hole defined therein, each of the drive plates comprises a second pivot hole defined therein, and each of the two connection members passing through the second pivot hole and the first pivot hole.

3. The mounting apparatus of claim 2, wherein the rear panel further comprises a L-shaped first stop portion protruding from the main plate and positioned below the opening; wherein the second block plates each comprises a restrictor plate extending inward from a front end thereof.

4. The mounting apparatus of claim 3, wherein the operation member further comprises two block portions extending from two opposite sides of the operation member respectively, wherein each of the two block portions is received in an inner side of the restrictor plate of the rear panel.

5. The mounting apparatus of claim 4, wherein the operation member further comprises two clip blocks respectively positioned close to the two block portions corresponding to the two bridge clips.

6. The mounting apparatus of claim 5, wherein the operation member further comprises a second stop portion extending at an angle from a bottom end of the operation member, wherein the second stop portion is received in an inner side of the first stop portion.

7. The mounting apparatus of claim 1, wherein each of the two connection members is L-shaped and comprises a first post and a second post.

8. The mounting apparatus of claim 7, wherein the second post comprises a raised block fixed on an outer side thereof and positioned close to a curved portion of each of the two connection members.

9. The mounting apparatus of claim 1, wherein the drive plates are separated by a distance and each comprises a bevel edge, a first straight edge, and a second straight edge.

10. The mounting apparatus of claim 9, wherein the rail is positioned close to the bevel edge, and substantially parallel to the bevel edge.

11. A mounting apparatus for mounting an expansion card to a rear panel of an electronic device, the mounting apparatus comprising:
   a latching member comprising a plurality of parallel drive plates, a connection plate fixed to the drive plates, and a plurality of latching portions fixed to a bottom of the latching member, wherein each of the drive plates defines a rail therein;
   an operation member comprising a plurality of pins each fixed to a bottom of the operation member corresponding to the rail of each of the drive plates, a handle extending from a top end of the operation member, and a resilient portion parallel to the handle, wherein the resilient portion comprises a latch block fixed on a side thereof away from the handle; and
   two connection members passed through the latching member and the rear panel for securing the latching member to the rear panel;

wherein each of the pins of the operation member is slidably received in the rail to rotate the latching member, each of the latching portions is received in a first block plate of the expansion card, the latch block of the operation member is received in a latch of the rear panel, thereby mounting the expansion card to the rear panel.

12. The mounting apparatus of claim 11, wherein the operation member further comprises two block portions extending from two opposite sides of the operation member respectively, wherein each of the two block portions is received in an inner side of a restrictor plate of the rear panel.

13. The mounting apparatus of claim 12, wherein the operation member further comprises two clip blocks respectively positioned close to the two block portions corresponding to two bridge clips of the rear panel.

14. The mounting apparatus of claim 13, wherein the operation member further comprises a second stop portion extending at an angle from a bottom end of the operation member, wherein the second stop portion is received in an inner side of a first stop portion of the rear panel.

15. An expansion card assembly comprising:
   an expansion card comprising a first block plate, wherein the first block plate comprises a connection portion fixed to an end of the expansion card, and an angled portion angled from a top end of the connection portion; and
   a mounting apparatus for mounting an expansion card to a rear panel of an electronic device, the mounting apparatus comprising:
      a latching member comprising a plurality of parallel drive plates, a connection plate fixed to the drive plates, and a plurality of latching portions fixed to a bottom of the latching member, wherein each of the drive plates defines a rail therein;
      an operation member comprising a plurality of pins each fixed to a bottom of the operation member corresponding to the rail of each of the drive plates, a handle extending from a top end of the operation member, and a resilient portion parallel to the handle, wherein the resilient portion comprises a latch block fixed on a side thereof away from the handle; and
      two connection members passed through the latching member and the rear panel for securing the latching member to the rear panel;
   wherein each of the pins of the operation member is slidably received in the rail to rotate the latching member, each of the latching portions is received in the first block plate of the expansion card, the latch block of the operation member is received in a latch of the rear panel, thereby mounting the expansion card to the rear panel.

16. The expansion card assembly of claim 15, wherein the operation member further comprises two block portions extending from two opposite sides of the operation member respectively, wherein each of the two block portions is received in an inner side of a restrictor plate of the rear panel.

17. The expansion card assembly of claim 16, wherein the operation member further comprises two clip blocks respectively positioned close to the two block portions corresponding to two bridge clips of the rear panel.

18. The expansion card assembly of claim 17, wherein the operation member further comprises a second stop portion extending at an angle from a bottom end of the operation member, wherein the second stop portion is received in an inner side of a first stop portion of the rear panel.

* * * * *